(12) United States Patent
Huang

(10) Patent No.: US 10,860,045 B1
(45) Date of Patent: Dec. 8, 2020

(54) HIGH VOLTAGE COMPATIBLE PUSH-PULL BUFFER CIRCUIT

(71) Applicant: Apple Inc., Cupertino, CA (US)

(72) Inventor: Bin Huang, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 16/296,157

(22) Filed: Mar. 7, 2019

(51) Int. Cl.
*G05F 1/575* (2006.01)
*H03F 3/30* (2006.01)
*H03F 3/45* (2006.01)
*G05F 3/26* (2006.01)

(52) U.S. Cl.
CPC .............. *G05F 1/575* (2013.01); *G05F 3/262* (2013.01); *H03F 3/3001* (2013.01); *H03F 3/45179* (2013.01)

(58) Field of Classification Search
CPC ........................................ G05F 1/575
See application file for complete search history.

(56) References Cited

U.S. PATENT DOCUMENTS

| | | | | |
|---|---|---|---|---|
| 4,668,919 A | * | 5/1987 | de Weck | H03F 3/3045 330/253 |
| 5,315,264 A | * | 5/1994 | Sundby | H03F 3/3001 330/253 |
| 5,532,616 A | * | 7/1996 | Keeney | G05F 3/267 326/30 |
| 6,144,234 A | * | 11/2000 | Nakamura | G11C 27/026 327/92 |
| 6,437,628 B1 | * | 8/2002 | Davenport | H03K 19/018514 327/112 |
| 7,663,439 B2 | | 2/2010 | Chang | |
| 8,638,164 B2 | | 1/2014 | Son et al. | |
| 9,543,912 B2 | | 1/2017 | Lee | |
| 2011/0169808 A1 | * | 7/2011 | Son | G09G 3/20 345/211 |
| 2016/0179115 A1 | * | 6/2016 | Kronmueller | H03F 3/45183 323/280 |

\* cited by examiner

*Primary Examiner* — Patricia T Nguyen
(74) *Attorney, Agent, or Firm* — Kowert, Hood, Munyon, Rankin & Goetzel, P.C.; Erik A. Heter

(57) ABSTRACT

A voltage regulator having a buffer circuit and method for operating the same is disclosed. A voltage regulator having a buffer circuit includes an input stage coupled to receive an input voltage and an output stage configured to provide an output signal on an output node. The output stage includes first and second output transistors coupled to the output node. The circuit further includes a buffer stage coupled between the input and output stages. The buffer stage includes a first buffer transistor having a gate terminal coupled to the input stage and a source terminal coupled to a gate terminal of the first output transistor. The circuit further includes a first current mirror coupled to the first buffer transistor, and a second current mirror coupled to the first current mirror, the second current mirror including the second output transistor.

20 Claims, 4 Drawing Sheets

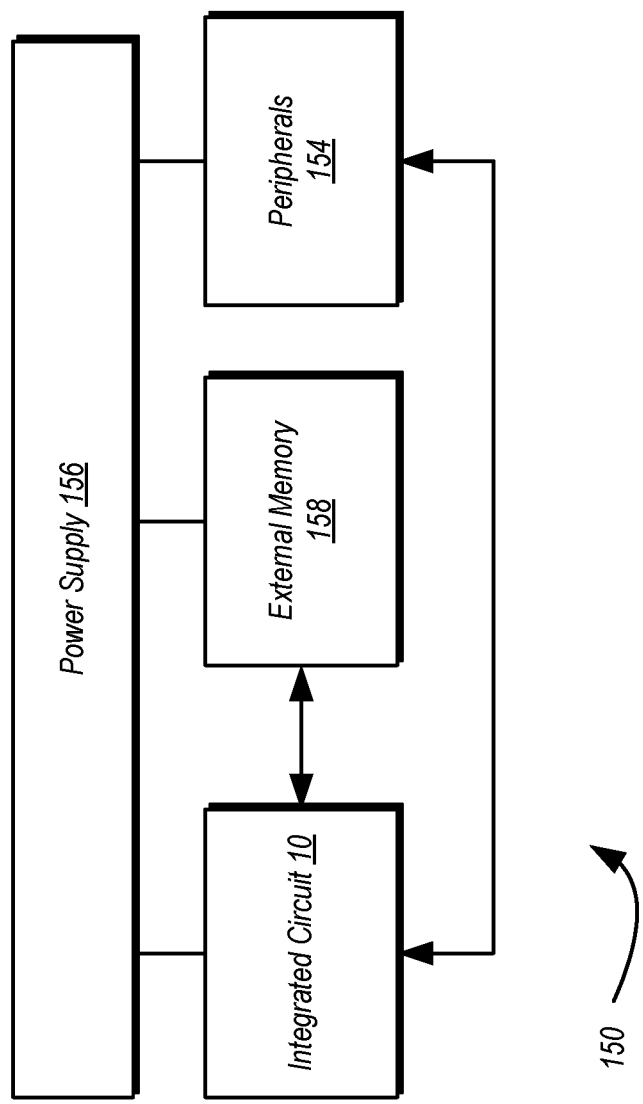

HIGH VOLTAGE COMPATIBLE PUSH-PULL BUFFER CIRCUIT

BACKGROUND

Technical Field

This disclosure is directed to electronic circuits, and more particularly, to buffer circuits.

Description of the Related Art

Buffer circuits are used in various electronic circuits. Among such circuits that employ buffers are low dropout (LDO) voltage regulators. In an LDO voltage regulator, a buffer may be placed between the output of an error amplifier and the gate terminal of a pass transistor. When implemented in an LDO voltage regulator, a buffer circuit may be capable of improving the regulators driving speed (or response time) and current sourcing/sinking capability. As such, load and line regulation may be improved by the use of a buffer in an LDO regulator.

SUMMARY

A buffer circuit and method for operating the same is disclosed. In one embodiment, a voltage regulator having a buffer circuit includes an input stage coupled to receive an input voltage and an output stage configured to provide an output voltage on an output node. The output stage includes first and second output transistors coupled to the output node. The circuit further includes a buffer stage coupled between the input and output stages. The buffer stage includes a first buffer transistor having a gate terminal coupled to the input stage and a source terminal coupled to a gate terminal of the first output transistor. The circuit further includes a first current mirror coupled to the first buffer transistor, and a second current mirror coupled to the first current mirror, the second current mirror including the second output transistor.

In one embodiment, an amount of current sunk by the output stage increases responsive to an increase in the voltage on the source terminal of the first buffer transistor. In the same embodiment, an amount of current sources by the output stage increases responsive to a decrease in the voltage on the source terminal of the first buffer transistor.

BRIEF DESCRIPTION OF THE DRAWINGS

The following detailed description makes reference to the accompanying drawings, which are now briefly described.

FIG. 4 is a block diagram of one embodiment of an example system.

Figure 1:
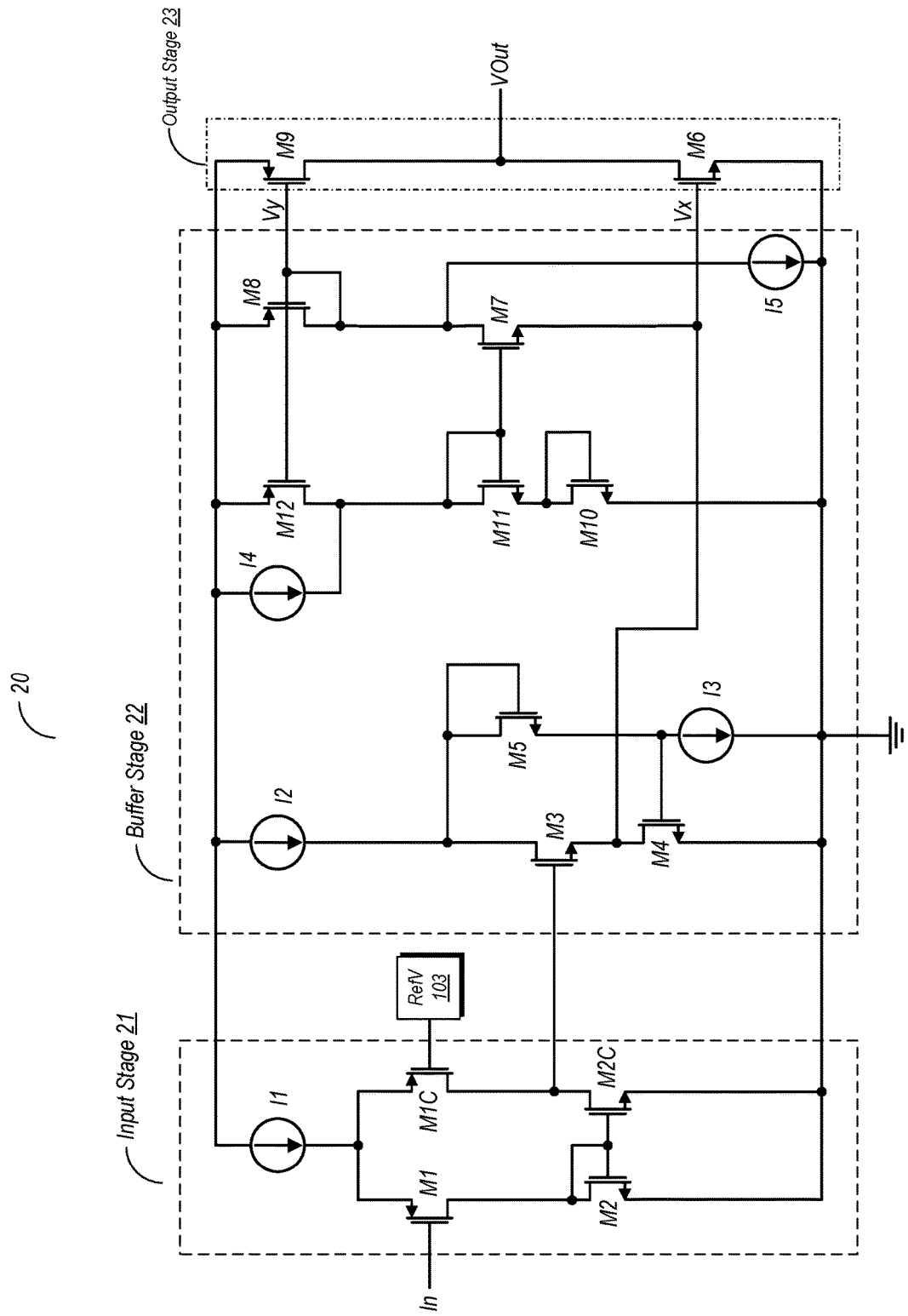
FIG. 1 is a schematic diagram of one embodiment of a voltage regulator including a buffer circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks]—is used herein to refer to structure (e.g., something physical, such as an electronic circuit). More specifically, this formulation is used to indicate that this structure is arranged to perform the one or more tasks during operation. A structure can be said to be "configured to" perform some task even if the structure is not currently, being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a buffer circuit that may be implemented in, e.g., a voltage regulator. When implemented in a voltage regulator, the buffer circuit may be coupled between an output of an error amplifier and a gate terminal of a pass transistor. The buffer circuit as disclosed herein may have a low quiescent current, a high maximum current driving capability, a low impedance gate driving node, and may be suitable for high voltage (e.g., 5 volts and up) designs.

Turning now to FIG. 1, a schematic diagram of one embodiment of a voltage regulator having a buffer circuit is shown. In the embodiment shown, circuit 20 may be subdivided into three stages, an input stage 21, a buffer stage 22, and an output stage 23.

Input stage 21 in the embodiment shown includes an error amplifier formed by transistors M1, M1C, M2, and M2C, along with a current source, I1, to provide current thereto. Transistors M1 and M1C form a differential input pair of the amplifier circuit. The input to circuit 20 is the gate terminal to M1 (e.g., a feedback voltage from the voltage regulator output), while the input to M1C is a reference voltage provided by a reference voltage circuit, RefV 103, which may be implemented in any suitable manner. Transistors M2 and M2C form a current mirror, with M2 being the diode coupled device. The current through M1 and M2, which is based on a voltage of the input signal 'In', is mirrored to the circuit leg that includes M2C.

Buffer stage 22 in the embodiment shown includes the remaining circuit elements shown, with the exception of transistors M6 and M9, which are designated as part of the output stage 23. The devices of buffer stage 22 include a first buffer transistor M3, along with second and third buffer transistors, M4 and M5, respectively, and current sources I2 and I3. As shown in FIG. 1, transistor M4 includes a drain terminal coupled to the source of M3, with its own source being coupled to ground. Third buffer transistor M5 includes gate and drain terminals coupled to the drain terminal of M3, and further includes a source terminal coupled to the gate of M4. First buffer transistor M3 includes a gate terminal coupled to the drain terminal of transistor M2C in input stage 21. Accordingly, the current mirrored from M2 to M2C in the embodiment shown affects the voltage on the gate terminal of M3. This in turn affects the voltage on the source of M3, which affects the output response of the circuit, as discussed further below.

In this particular embodiment, transistors M3, M4, and M5, along with current sources I2 and I3, form a voltage-shifted flipped-voltage follower. The feedback loop formed by transistors M3, M4, and M5 and current source I3 dynamically adjusts the drain current of M4 in order to allow the source terminal of this device to provide fast tracking of its gate terminal. Thus, the feedback loop makes the source terminal of M3 a low impedance node. Transistor M5 in the embodiment shown acts as a voltage level shifter to ensure that M3 has enough drain-source voltage headroom so that it may remain operating in the saturation region. The quiescent voltage on the source terminal of M3 is slightly greater than its threshold voltage, while M5 acts to cause the drain voltage of M3 to be approximately twice its threshold voltage, assuming the respective threshold voltages of M3, M4, M5, and M6 are substantially equal.

The buffer stage 22 in the embodiment shown further includes transistors M7, M8, M10, M11 and M12, as well as current sources I4 and I5. Transistor M12 and current source I5 the embodiment shown are optional, and thus embodiments not including these devices may fall within the scope of this disclosure. Transistors M6 and M9 of output stage 23 operate as first and second output transistors, respectively, in this embodiment, acting to sink/source current during the operation of the circuit. The drain terminals of each of these devices is coupled to the output node, 'VOut', of output stage 23, from which the output voltage (or output signal) is provided.

Transistor M12 in the embodiment shown copies the drain current from M7 and M8 and provides this copied current to the diode-connected devices M11 and M10 so as to dynamically drive the gate terminal of M7. Thus, with the help of M12, transistors M7, M8, M10, M11 (along with M12) form a weak positive feedback loop to dynamically adjust the source and gate voltages of M7. This, in turn, results in faster driving of transistors M6 and M9, thereby improving the settling speed of the voltage regulator.

Circuit 20 in the embodiment shown includes two current mirrors. The first current mirror includes first and second current mirror transistors M7 and M11, respectively, of buffer stage 22. The first current mirror transistor M7 includes a source terminal coupled to the source terminal of the first buffer transistor, M3, and is further coupled to the gate terminal of the first output transistor M6. The second current mirror transistor M11 includes a gate terminal coupled to a gate terminal of the first current mirror transistor, with this device being diode-coupled. The second current mirror includes a third current mirror transistor M8 and transistor, M9, the latter being the pass transistor for the voltage regulator implemented by circuit 20. The drain terminal of M8 is coupled to a drain terminal of the first current mirror transistor, M7, with M8 being a diode-coupled device. Additionally, the gate and drain terminals of the third current mirror transistor are coupled to a gate terminal of the second output transistor, M9, which also serves as the pass transistor of the voltage regulator.

Transistor M10 in the embodiment shown is designed to match M6, while transistor M11 is designed to match M7 in order to properly bias the gate terminal of the latter device. When circuit 20 is in the quiescent state, a properly biased gate of M7 has a gate voltage that is approximately twice the gate-source voltage of M6. When circuit 20 is not in the quiescent state, the gate voltage of M7 is adaptive depending on its drain current. This is accomplished in this embodiment by having transistors M10 and M11 as diode-coupled devices.

The operation of the first and second output devices, M6 and M9 respectively, is dependent on voltage on their respective gate terminals. Voltage Vx on the gate terminal of transistor M6 is received from the source of first buffer transistor M3 in buffer stage 22. Voltage Vy on the gate terminal of transistor M9 is dependent on the operation of the circuit based on voltage Vx. Accordingly, voltage Vy has a dependency on voltage Vx.

Voltage Vx in the embodiment shown, originating on the source terminal of M3, is dependent on the voltage present on the gate terminal of this same transistor. More particularly, the source voltage of M3 follows the gate voltage of this device. Thus, when the voltage on the gate of M3 increases, the source voltage of M3 also increases. Similarly, if the voltage on the gate terminal of M3 decreases, the corresponding source voltage also decreases. Since the voltage Vx is dependent on the gate voltage of M3, it thus follows that Vx varies responsive to variations in the voltage of an input signal received on the input node, 'In', of circuit 20, namely the voltage on the gate terminal of M1.

An increase in the voltage Vx, responsive to an increase in the gate voltage of M3, results in a reduction of the gate-source voltage of transistor M7. As a result, the current through both transistors M7 and M8 are reduced. The reduction in current through M8 thus current through M9 is also reduced. Accordingly, when voltage Vx rises, voltage Vy also rises, and the amount of current sourced by M9 is also reduced. Meanwhile, the increased voltage Vx results in an increase in current through M6. Accordingly, an increase in Vx results in an increase of the amount of current sunk and a decrease in the amount of current sourced by circuit 20.

When voltage Vx decreases, the gate-source voltage across M6 also falls. Accordingly, a decrease in voltage Vx causes a reduction in the amount of current sunk by circuit 20. With respect to M7, a decrease in voltage Vx results in an increase in its gate-source voltage. Accordingly, the current through M7 increases responsive to a decrease in Vx. This increase in current through M7 thus causes a reduction in the voltage Vy, and correspondingly, an increase in current through both M8 and M9. The increase in current through M9 thus results in an increase in the amount of current sourced by circuit 20.

In the embodiment shown, transistor M7 provides embedded push-pull operation, and thus output stage 23 operates as a class AB amplifier. This may enhance both the driving capability and driving speed of circuit 20. Generally speaking, the first current mirror in the embodiment shown reduces an amount of current provided thereby responsive to an increase in a voltage (Vx) on the source terminal of the first buffer transistor, and increases an amount of current provided thereby responsive to a decrease in the voltage on the source terminal of the first buffer transistor. The second current mirror reduces an amount of current provided thereby responsive to a reduction in current provided by the first current mirror, and increases the amount of current provided thereby responsive to an increase in current provided by the first current mirror.

Figure 2:
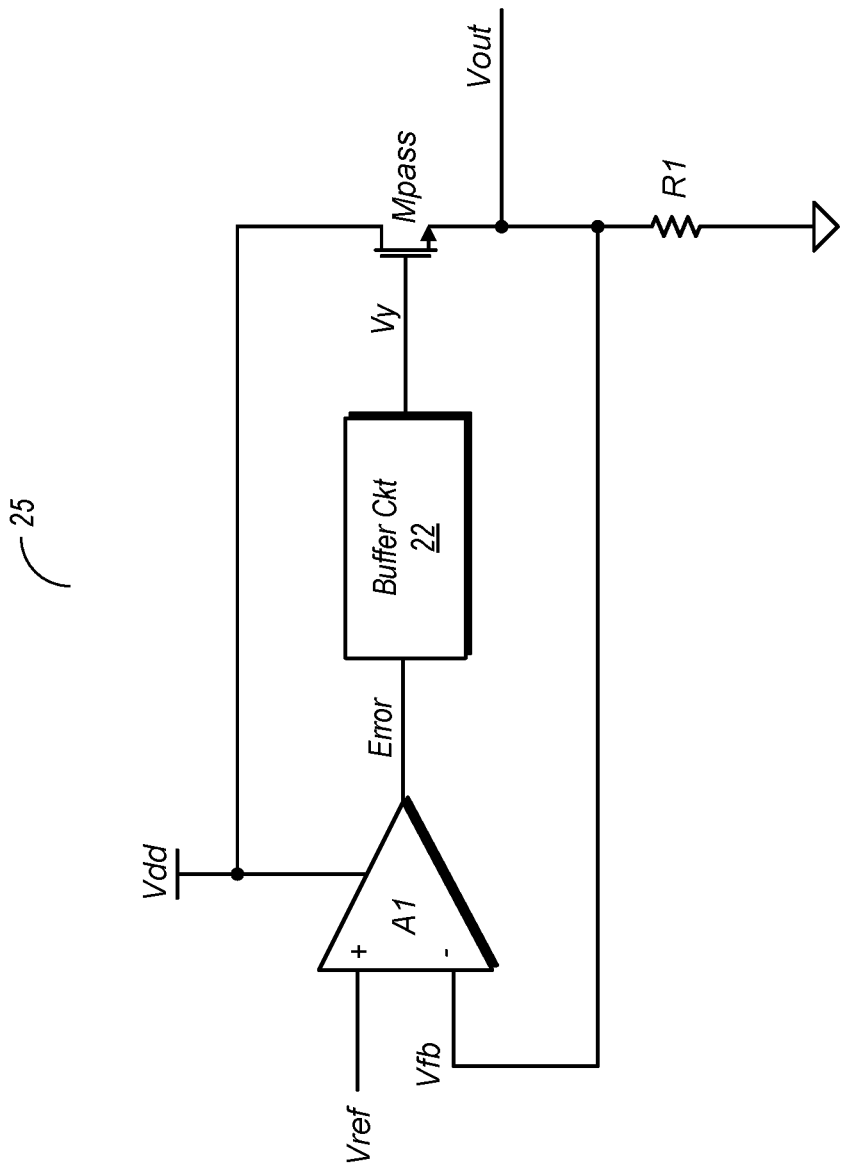
FIG. 2 is a schematic diagram of one embodiment of a voltage regulator including a buffer circuit.

FIG. 2 is schematic diagram of one embodiment of a voltage regulator having a buffer circuit 22, which may be implemented using the devices of buffer stage 22 in the circuit of FIG. 1. It is noted that the voltage regulator 25 is provided here for the sake of example, but is not intended to limit the scope of this disclosure. On the contrary, the buffer circuit disclosed herein may be used in a wide variety of voltage regulator circuits, and more generally, in any voltage regulator in which a buffer is used. It is additionally noted that various embodiments of the buffer circuit falling within the scope of this disclosure may be used in other types of circuits as well.

Voltage regulator 25 in the embodiment shown includes an error amplifier A1 that is coupled to receive a reference voltage (Wren and a feedback voltage ('Vfb'). This amplifier may be equivalent to input stage of circuit 20 shown in FIG. 1 for at least some embodiments. The reference voltage corresponds to a desired output voltage, while the feedback voltage corresponds to an actual output voltage provided by the voltage regulator. The feedback voltage in this particular example, taken from the junction of pass transistor MPass and resistor R1, is equivalent to the output voltage provided by voltage regulator 25.

Based on a difference between the reference voltage and the feedback voltage, error amplifier A1 generates an error signal ('Error') that is input into circuit 20. In turn, circuit 20 generates an output signal, Vy, that is provided to the gate of pass transistor Mpass. The output voltage, Vout, in this example is taken from the source terminal of pass transistor Mpass.

The use of a buffer circuit discussed above in a voltage regulator may aid in the operation of the latter. For example, the buffer stage of FIG. 1, when used in a voltage regulator, may allow for faster transient response and reduced settling time. Additional benefits may include higher current driving capability, and better stability. These advantages may be obtained in various embodiments due to the buffer circuit making the gate terminal of the pass transistor a low impedance node.

Figure 3:
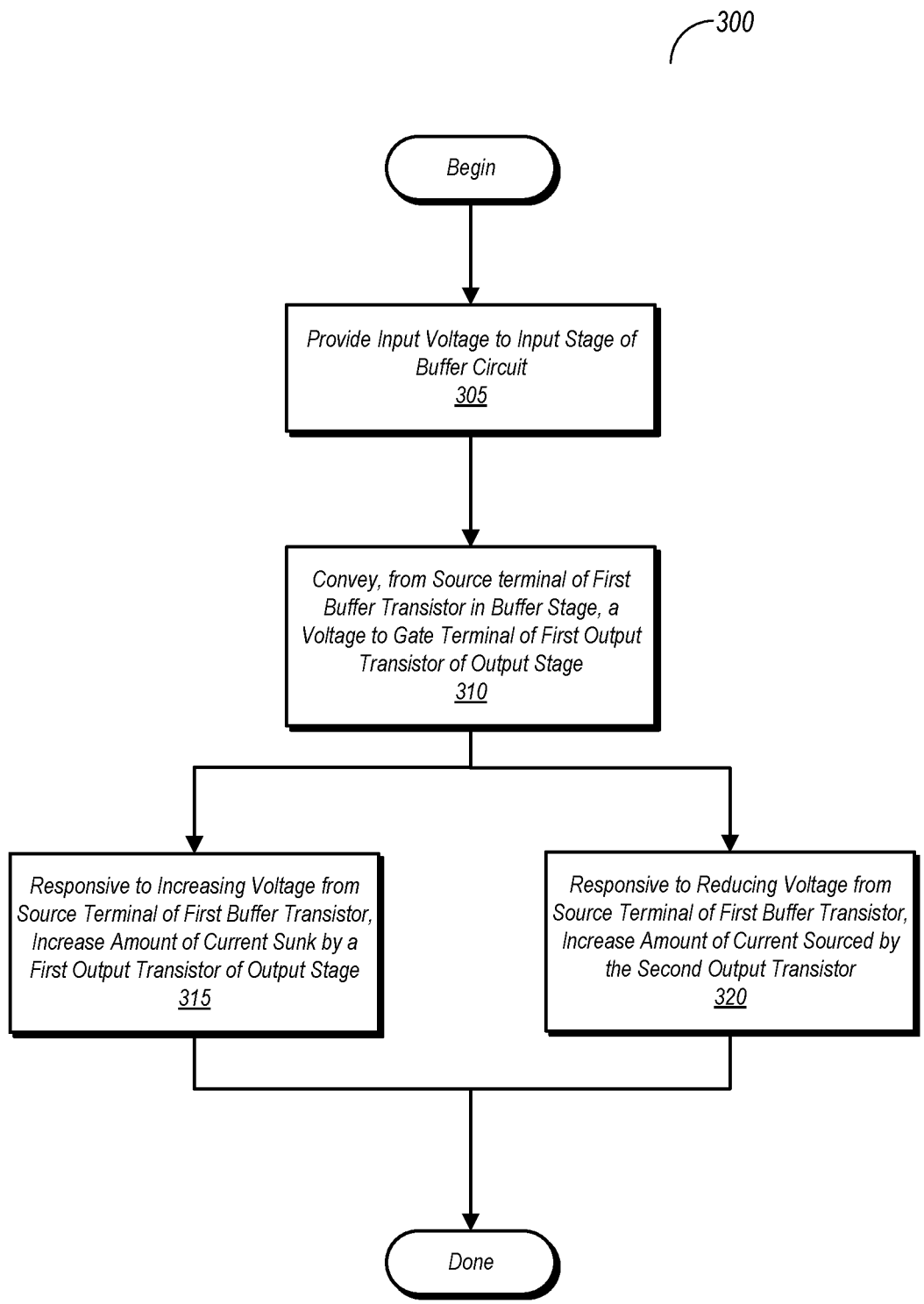
FIG. 3 is a flow diagram illustrating one embodiment of a method for operating a buffer circuit.

FIG. 3 is a flow diagram illustrating one embodiment of a method for operating a buffer circuit. Method 300 as shown here may be performed with various embodiments of a buffer circuit as discussed above. Embodiments of a buffer circuit not explicitly discussed herein, but capable of carrying out method 300, may also fall within the scope of this disclosure.

Method 300 includes providing an input voltage to an input stage of a buffer circuit (block 305). In one embodiment, the input voltage may be provided in the form of an error signal from an error amplifier when the buffer circuit is implemented in a voltage regulator. Method 300 further includes conveying, from a source terminal of a first buffer transistor in a buffer stage, a voltage to a gate terminal of a first output transistor of an output stage (block 310). Responsive to an increasing voltage from the source terminal of the first buffer transistor, an amount of current sunk by the first output transistor may increase (block 315). Responsive to a reduction in voltage from the source terminal of the first buffer transistor, an amount of current sourced by the second output transistor increases (block 320).

In various embodiments, the method may include reducing an amount of current provided by a first current mirror responsive to an increase in the voltage from the source terminal of the first buffer transistor, the first current mirror being coupled to a gate terminal of the first output transistor and further coupled to the source terminal of the first buffer transistor. The method may also include increasing the amount of current provided by the first current mirror responsive to a reduction in the voltage from the source terminal of the first buffer transistor. Some embodiments of the method may also include increasing an amount of current provided by a second current mirror responsive to an increase in the amount of current provided by the first current mirror, the second current mirror including the second output transistor and reducing an amount of current provided by the second current mirror responsive to a decrease in the amount of current provided by the first current mirror.

With respect to the input and buffer stages, the method may include providing the input voltage to a first transistor of the input stage and providing a reference voltage to a second transistor of the input stage. This may also include causing an increase of the voltage on the source terminal of the first buffer transistor responsive to an increase of the input voltage and causing a decrease of the voltage on the source terminal of the first buffer transistor responsive to a decrease of the input voltage.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments of system 150, circuitry that includes an embodiment of the buffer circuit discussed above may be implemented. Such circuitry may include any embodiment of a voltage regulator that may include a buffer circuit, as well as any other type of circuitry in which such a buffer circuit may be useful. Moreover, the buffer circuit as disclosed herein may be used in circuits that operate on higher voltages (e.g., 5 volts or greater).

Numerous variations and modifications will become apparent to those skilled in the art once the above disclosure is fully appreciated. It is intended that the following claims be interpreted to embrace all such variations and modifications.

What is claimed is:

1. A circuit comprising:
an input stage coupled to receive an input voltage;
an output stage configured to provide an output signal on an output node, the output stage including a first output transistor and a second output transistor each coupled to the output node; and
a buffer stage coupled between the input stage and the output stage, the buffer stage including a first buffer transistor having a gate terminal coupled to the input stage and a source terminal coupled to a gate terminal of the first output transistor, wherein the source terminal of the first buffer transistor is further coupled to a first current mirror, and wherein the first current mirror is coupled to a second current mirror, the second current mirror including the second output transistor;
wherein the buffer stage further includes a second buffer transistor having a drain terminal coupled to the source terminal of the first buffer transistor and a source terminal coupled to a ground node, and a third buffer transistor having gate and drain terminals coupled to a drain terminal of the first buffer transistor and a source terminal coupled to a gate terminal of the second buffer transistor.

2. The circuit as recited in claim 1, wherein the first output transistor is configured to increase an amount of current sunk by the output stage responsive to an increase in a voltage on the source terminal of the first buffer transistor, and wherein the second output transistor is configured to increase an amount of current sourced by the output stage responsive to a decrease in voltage on the source terminal of the first buffer transistor.

3. The circuit as recited in claim 1, wherein the first buffer transistor is configured to vary a voltage on its source terminal responsive to a variation of the input voltage received by the input stage.

4. The circuit as recited in claim 1, wherein the input stage includes a first input transistor having a gate terminal coupled to receive the input voltage, and a second input stage coupled to receive a reference voltage.

5. The circuit as recited in claim 1, wherein the first current mirror includes a first current mirror transistor having a source terminal coupled to the source terminal of the first buffer transistor and further coupled to the gate terminal of the first output transistor, wherein the first current mirror further includes a second current mirror transistor having a gate terminal coupled to a gate terminal of the first current mirror transistor, wherein the second current mirror transistor is diode-coupled.

6. The circuit as recited in claim 5, wherein the second current mirror includes a third current mirror transistor having a drain terminal coupled to a drain terminal of the first current mirror transistor, wherein the third current mirror transistor is diode-coupled.

7. The circuit as recited in claim 6, wherein gate and drain terminal of the third current mirror transistor are coupled to a gate terminal of the second output transistor.

8. The circuit as recited in claim 1, wherein the first current mirror is configured to reduce an amount of current provided thereby responsive to an increase in a voltage on the source terminal of the first buffer transistor, and further configured to increase an amount of current provided thereby responsive to a decrease in the voltage on the source terminal of the first buffer transistor.

9. The circuit as recited in claim 1, wherein the second current mirror is configured to reduce an amount of current provided thereby responsive to a reduction in current provided by the first current mirror, and further configured to increase the amount of current provided thereby responsive to an increase in current provided by the first current mirror.

10. A method comprising:
providing an input voltage to a gate terminal of a first input transistor in an error amplifier of an input stage of a circuit;
providing a reference voltage to a gate terminal of a second input transistor
conveying, from a source terminal of a first buffer transistor in a buffer stage, a voltage to a gate terminal of first output transistor of an output stage of the circuit, the output stage including first and second output transistors, the voltage being dependent on the input voltage;
varying the voltage on the source terminal of the first buffer transistor responsive to variations of the input voltage;
responsive to increasing the voltage from the source terminal of the first buffer transistor, increasing an amount of current sunk by the first output transistor; and
responsive to reducing the voltage from the source terminal of the first buffer transistor, increasing an amount of current sourced by the second output transistor.

11. The method as recited in claim 10, further comprising:
reducing an amount of current provided by a first current mirror responsive to an increase in the voltage from the source terminal of the first buffer transistor, the first current mirror being coupled to a gate terminal of the first output transistor and further coupled to the source terminal of the first buffer transistor; and
increasing the amount of current provided by the first current mirror responsive to a reduction in the voltage from the source terminal of the first buffer transistor.

12. The method as recited in claim 11, further comprising:
increasing an amount of current provided by a second current mirror responsive to an increase in the amount of current provided by the first current mirror, the second current mirror including the second output transistor;
reducing an amount of current provided by the second current mirror responsive to a decrease in the amount of current provided by the first current mirror.

13. The method as recited in claim 10, further comprising:
causing an increase of the voltage on the source terminal of the first buffer transistor responsive to an increase of the input voltage; and
causing a decrease of the voltage on the source terminal of the first buffer transistor responsive to a decrease of the input voltage.

14. A voltage regulator circuit comprising:
an input stage, the input stage including an error amplifier coupled to receive a reference signal and a feedback signal and configured to generate an error signal, wherein the error amplifier includes a first input transistor having a gate terminal coupled to receive a feedback signal, and a second input transistor coupled to receive a reference voltage, wherein the first input transistor is configured to vary a voltage on its source terminal responsive to a variation of a voltage of the feedback signal received by the input stage;
an output stage having a pass transistor configured to provide a regulated output voltage; and
a buffer circuit coupled between an output of the error amplifier and a gate terminal of the pass transistor, the buffer circuit including a first buffer transistor having a gate terminal coupled to the input stage and a source terminal coupled to a gate terminal of a first output transistor, wherein the source terminal of the first buffer transistor is further coupled to a first current mirror, and wherein the first current mirror is coupled to a second current mirror, the second current mirror including the pass transistor.

15. The voltage regulator circuit as recited in claim 14, wherein the first output transistor is configured to increase an amount of current sunk by the voltage regulator responsive to an increase in a voltage on the source terminal of the first buffer transistor, and wherein the pass transistor is configured to increase an amount of current sourced by the voltage regulator responsive to a decrease in voltage on the source terminal of the first buffer transistor.

16. The voltage regulator circuit as recited in claim 14, wherein the first current mirror is configured to reduce an amount of current provided thereby responsive to an increase in a voltage on the source terminal of the first buffer transistor, and further configured to increase an amount of current provided thereby responsive to a decrease in the voltage on the source terminal of the first buffer transistor.

17. The voltage regulator circuit as recited in claim 14, wherein the second current mirror is configured to reduce an amount of current provided thereby responsive to a reduction in current provided by the first current mirror, and further configured to increase the amount of current provided thereby responsive to an increase in current provided by the first current mirror.

18. The voltage regulator circuit as recited in claim 14, wherein the buffer circuit further includes a second buffer transistor having a drain terminal coupled to the source terminal of the first buffer transistor and a source terminal coupled to a ground node, and a third buffer transistor having gate and drain terminals coupled to a drain terminal of the first buffer transistor and a source terminal coupled to a gate terminal of the second buffer transistor.

19. The circuit of claim 1, wherein the output stage is configured to provide the output signal as a regulated output voltage, and wherein the input voltage is based on the regulated output voltage.

20. The method of claim 10, further comprising providing, from the output stage, a regulated output voltage, and further comprising generating the input voltage based on the regulated output voltage.

* * * * *